US011127453B1

(12) United States Patent
Choi

(10) Patent No.: US 11,127,453 B1
(45) Date of Patent: Sep. 21, 2021

(54) MEMORY DEVICE OF PERFORMING PRECHARGE OPERATION AND METHOD OF OPERATING THE SAME

(71) Applicant: SK hynix Inc., Icheon-si Gyeonggi-do (KR)

(72) Inventor: Hyung Jin Choi, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 16/983,792

(22) Filed: Aug. 3, 2020

(30) Foreign Application Priority Data

Mar. 5, 2020 (KR) ........................ 10-2020-0027941

(51) Int. Cl.
| | | |
|---|---|---|
| *G11C 7/12* | (2006.01) | |
| *G11C 11/4091* | (2006.01) | |
| *G11C 11/4093* | (2006.01) | |
| *G11C 11/408* | (2006.01) | |
| *G11C 11/4076* | (2006.01) | |
| *G11C 11/4074* | (2006.01) | |
| *G11C 11/4094* | (2006.01) | |
| *G11C 16/24* | (2006.01) | |
| *G11C 7/22* | (2006.01) | |
| *G11C 16/04* | (2006.01) | |
| *G11C 16/26* | (2006.01) | |
| *G11C 16/34* | (2006.01) | |

(52) U.S. Cl.
CPC ............ *G11C 11/4091* (2013.01); *G11C 7/12* (2013.01); *G11C 7/22* (2013.01); *G11C 11/4074* (2013.01); *G11C 11/4076* (2013.01); *G11C 11/4082* (2013.01); *G11C 11/4093* (2013.01); *G11C 11/4094* (2013.01); *G11C 16/0483* (2013.01); *G11C 16/24* (2013.01); *G11C 16/26* (2013.01); *G11C 16/3459* (2013.01)

(58) Field of Classification Search
CPC ..... G11C 16/10; G11C 16/3459; G11C 16/24; G11C 16/26; G11C 16/0483; G11C 11/4091; G11C 7/22; G11C 7/12
See application file for complete search history.

(56) References Cited

U.S. PATENT DOCUMENTS

| 8,422,325 | B2 * | 4/2013 | Choi ...................... G11C 16/24 |
| | | | 365/203 |
| 2006/0221739 | A1 * | 10/2006 | Kim ....................... G11C 16/24 |
| | | | 365/203 |
| 2010/0329036 | A1 * | 12/2010 | Park .................... G11C 16/3418 |
| | | | 365/185.25 |

(Continued)

FOREIGN PATENT DOCUMENTS

| KR | 1020120037161 A | 4/2012 |
| KR | 1020190006840 A | 1/2019 |

*Primary Examiner* — Mushfique Siddique
(74) *Attorney, Agent, or Firm* — William Park & Associates Ltd.

(57) ABSTRACT

The present technology relates to a memory device and a method of operating the same. The memory device includes a memory block, a first page buffer group and a second page buffer group connected to bit lines of the memory block, and control logic configured to control the first page buffer group and the second page buffer group to perform a sense node precharge operation partially simultaneously.

19 Claims, 13 Drawing Sheets

(56) References Cited

U.S. PATENT DOCUMENTS

| | | | |
|---|---|---|---|
| 2012/0314506 A1* | 12/2012 | Baek | G11C 7/12 |
| | | | 365/185.25 |
| 2013/0003453 A1* | 1/2013 | Park | G11C 16/10 |
| | | | 365/185.2 |
| 2017/0263293 A1* | 9/2017 | Lee | G11C 7/12 |
| 2018/0336949 A1* | 11/2018 | Choi | G11C 16/26 |
| 2021/0050051 A1* | 2/2021 | Yang | G11C 11/4076 |

* cited by examiner

MEMORY DEVICE OF PERFORMING PRECHARGE OPERATION AND METHOD OF OPERATING THE SAME

CROSS-REFERENCE TO RELATED APPLICATION

The present application claims priority under 35 U.S.C. § 119(a) to Korean patent application number 10-2020-0027941, filed on Mar. 5, 2020, in the Korean Intellectual Property Office, the entire disclosure of which is incorporated herein by reference.

BACKGROUND

1. Technical Field

The present disclosure relates to a memory device and a method of operating the same, and more particularly, to a memory device and a method of operating the same capable of improving a current and voltage drop phenomenon of the memory device.

2. Related Art

A semiconductor memory device is a memory device that is implemented using a semiconductor such as silicon (Si), germanium (Ge), gallium arsenide (GaAs), or indium phosphide (InP). Semiconductor memory devices are generally classified as volatile memory devices or non-volatile memory devices.

Volatile memory devices are memory devices in which stored data is lost when a supply of power is interrupted. Volatile memory devices include static RAM (SRAM), dynamic RAM (DRAM), synchronous DRAM (SDRAM), and the like. Non-volatile memory devices are memory devices that maintain stored data even when a supply of power is interrupted. Non-volatile memory devices include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), and the like. Flash memory is largely classified as NOR type or NAND type. The memory device performs a program, read, or erase operation under control of a controller. The memory device includes a memory cell array in which data is stored. The memory device performs the program, read, and erase operations. The memory device includes a Plurality of page buffers. During the read operation and the verify operation, the page buffers precharge sense nodes of the page buffers to a set potential level.

SUMMARY

A memory device according to an embodiment of the present disclosure includes a memory block, a first page buffer group and a second page buffer group connected to bit lines of the memory block, and control logic configured to control the first page buffer group and the second page buffer group to perform a sense node precharge operation partially simultaneously.

A memory device according to an embodiment of the present disclosure includes a memory block, at least two or more page buffer groups connected to bit lines of the memory block, and control logic configured to control a read operation for the memory block by controlling the two or more page buffer groups. The control logic is further configured to control activation timings of the two or more respective page buffer groups to be different from each other during a sense node precharge operation of the read operation.

A method of operating a memory device according to an embodiment of the present disclosure includes precharging bit lines of a memory block to a set level and applying a read voltage to a selected word line of the memory block, precharging a sense node of each of first page buffers and second page buffers connected to the bit lines and controlling a timing for precharging the sense node of the first page buffers and a timing for precharging the sense node of the second page buffers to be different from each other, performing an evaluation operation to control a potential level of the sense node of the first page buffers and the sense node of the second page buffers based on a current amount of the bit lines, and sensing the potential level of the sense node of the first page buffers and the sense node of the second page buffers.

DETAILED DESCRIPTION

The advantages and features of the present disclosure, and a method of accomplishing the advantages and features, will be described through embodiments that are described in detail below together with the accompanying drawings. However, the present disclosure is not limited to the embodiments described herein and may be embodied in other forms. The present embodiments are provided to describe the technical spirit of the present disclosure in detail to those skilled in the art to which the present disclosure pertains so that those skilled in the art may implement the technical spirit of the present disclosure.

Throughout the specification, in a case in which a portion is "connected" to another portion, the case includes not only a case in which the portion is "directly connected" to the other portion but also a case in which the portion is "indirectly connected" to the other portion with another component interposed therebetween. Throughout the specification, in a case in which a portion includes a component, the case means that the portion may include other components without excluding other components unless specifically stated otherwise.

Some embodiments of the present disclosure provide a memory device and a method of operating the memory device capable of improving a drop phenomenon of a current and a voltage during a sense node precharge operation of the memory device. The present teachings, for example, divide page buffers of the memory device into a plurality of page buffer groups, dualize the sense node precharge operation of the plurality of page buffer groups, and perform the sense node precharge operation. Therefore, the present teachings may improve a drop phenomenon of a current and a voltage during the sense node precharge operation.

Figure 1:
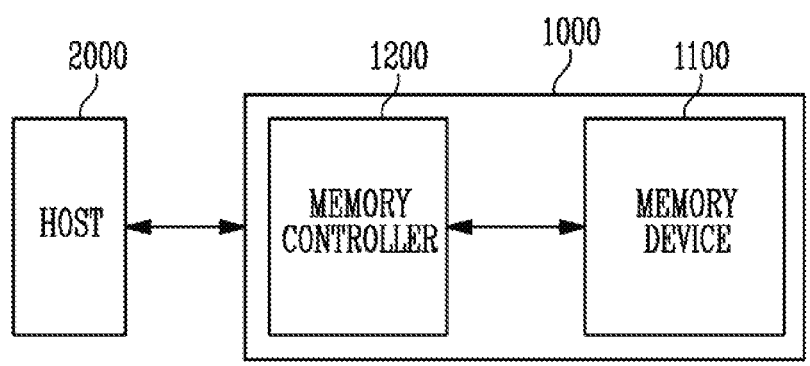
FIG. 1 is a diagram for describing a memory system according to an embodiment of the present disclosure.

FIG. 1 is a diagram for describing a memory system 1000 according to an embodiment of the present disclosure.

Referring to FIG. 1, the memory system 1000 includes a memory device 1100 in which data is stored, and a memory controller 1200 that controls the memory device 1100 under control of a host 2000.

The host 2000 may communicate with a the memory system 1000 by using an interface protocol such as a peripheral component interconnect-express (PCI-E), an advanced technology attachment (ATA), a serial ATA (SATA), a parallel ATA (PATA), or a serial attached SCSI (SAS). In addition, the interface protocol between the host 2000 and the memory system 1000 is not limited to the above-described example, and may be one of other interface protocols such as a universal serial bus (USB), a multimedia card (MMC), an enhanced small disk interface (ESDI), and integrated drive electronics (IDE).

The memory controller 1200 may generally control an operation of the memory system 1000 and control a data exchange between the host 2000 and the memory device 1100. For example, the memory controller 1200 may control the memory device 1100 according to a request of the host 2000 to program or read data. In addition, the memory controller 1200 may store information of main memory blocks and sub memory blocks included in the memory device 1100, and may select the memory device 1100 to perform a program operation on the main memory block or the sub memory block according to a data amount loaded for the program operation. According to an embodiment, the memory device 1100 may include double data rate synchronous dynamic random access memory (DDR SDRAM), low power double data rate4 (LPDDR4) SDRAM, graphics double data rate (GDDR) SDRAM, low power DDR (LPDDR), Rambus dynamic random access memory (RDRAM), or flash memory.

The memory device 1100 may perform a program, read, or erase operation under control of the memory controller 1200.

Figure 2:
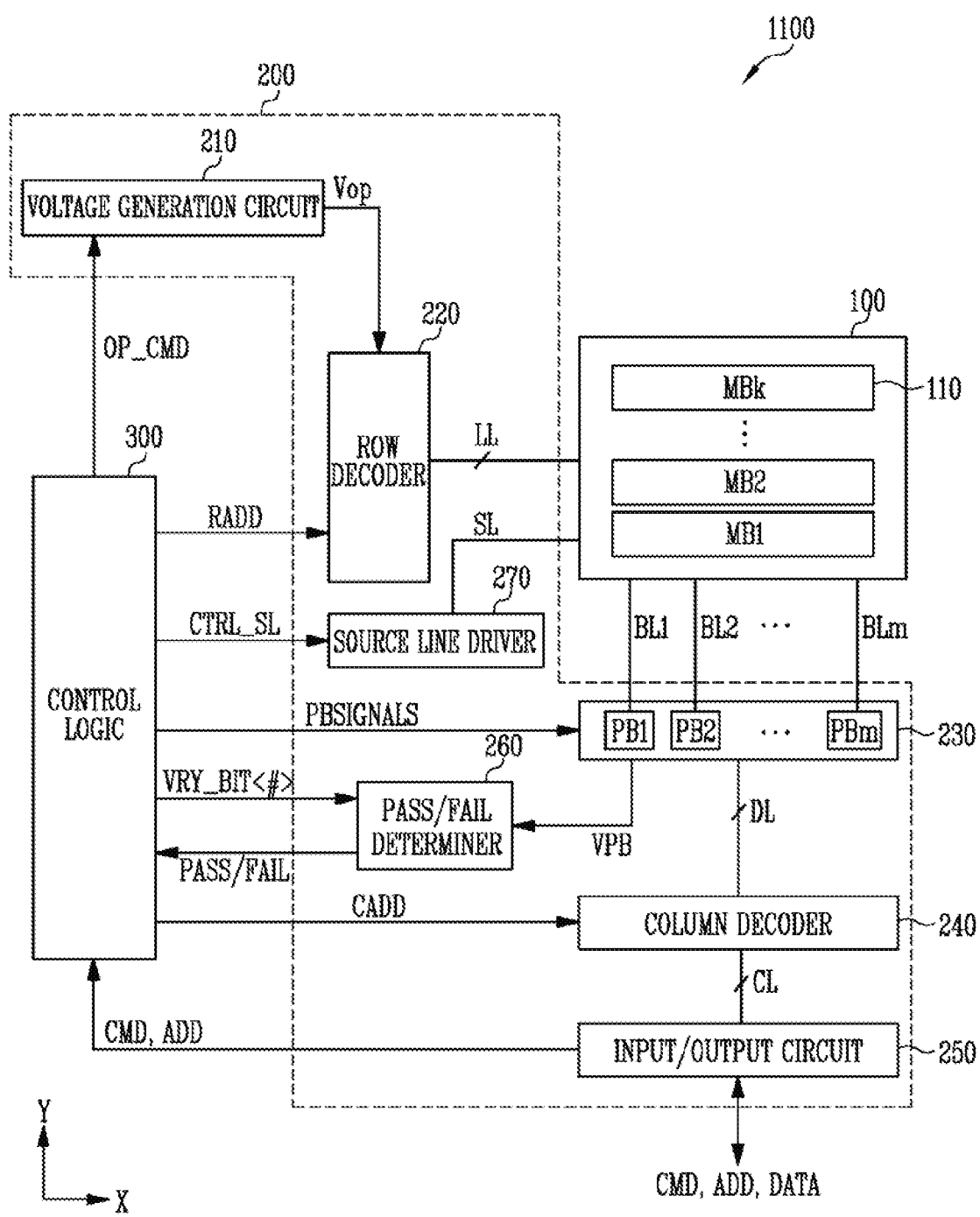
FIG. 2 is a diagram for describing a memory device of FIG. 1.

FIG. 2 is a diagram for describing the memory device 1100 of FIG. 1.

Referring to FIG. 2, the memory device 1100 may include a memory cell array 100 in which data is stored. The memory device 1100 may include peripheral circuits 200 configured to perform a program operation for storing data in the memory cell array 100, a read operation for outputting the stored data, and an erase operation for erasing the stored data. The memory device 1100 may include control logic 300 that controls the peripheral circuits 200 according to the control of the memory controller 1200 of FIG. 1.

The memory cell array 100 may include a plurality of memory blocks MB1 to MBk; 110 (k is a positive integer). Local lines LL and bit lines BL1 to BLm (m is a positive integer) may be connected to each of the memory blocks MB1 to MBk; 110. For example, the local lines LL may include a first select line, a second select line, and a plurality of word lines arranged between the first and second select lines. In addition, the local lines LL may include dummy lines arranged between the first select line and the word lines, and between the second select line and the word lines. Here, the first select line may be a source select line, and the second select line may be a drain select line. For example, the local lines LL may include the word lines, the drain and source select lines, and source lines. For example, the local lines LL may further include the dummy lines. For example, the local lines LL may further include pipe lines. The local lines LL may be connected to the memory blocks MB1 to MBk; 110, respectively, and the bit lines BL1 to BLm may be commonly connected to the memory blocks MB1 to MBk; 110. The memory blocks MB1 to MBk; 110 may be implemented in a two-dimensional or three-dimensional structure. For example, the memory cells may be arranged in a direction parallel to a substrate in the memory block 110 of the two-dimensional structure. For example, the memory cells may be stacked in a direction perpendicular to the substrate in the memory block 110 of the three-dimensional structure.

The peripheral circuits 200 may be configured to perform the program, read, and erase operations of the selected memory block 110 under control of the control logic 300. For example, the peripheral circuits 200 may apply a read voltage to a selected word line among the plurality of word lines under control of the control logic 300 and apply a pass voltage to the remaining word lines to read data stored in memory cells connected to the selected word line. In addition, the peripheral circuits 200 may apply a verify voltage to a selected word line among the plurality of word lines under the control of the control logic 300 and apply a pass voltage to the remaining word lines to verify the memory cells connected to the selected word line. For example, the peripheral circuits 200 may include a voltage generation circuit 210, a row decoder 220, a read/write circuit 230, a column decoder 240, an input/output circuit 250, a pass/fail determiner (pass/fail check circuit) 260, and a source line driver 270.

The voltage generation circuit 210 may generate various operation voltages Vop used in the program, read, and erase operations in response to an operation signal OP_CMD. In addition, the voltage generation circuit 210 may selectively discharge the local lines LL in response to the operation signal OP_CMD. For example, the voltage generation circuit 210 may generate a program voltage, a verify voltage, pass voltages, a turn on voltage, and a read voltage, and the like under the control of the control logic 300.

The row decoder 220 may transfer the operation voltages Vop to the local lines LL connected to the selected memory block 110 in response to row address RADD.

The read/write circuit 230 may include a plurality of page buffers PB1 to PBm connected to the bit lines BL1 to BLm. The page buffers PB1 to PBm may operate in response to page buffer control signals PBSIGNALS. For example, during the program operation, the page buffers PB1 to PBm temporarily stores data received through data lines DL and controls a potential level of the corresponding bit lines BL1 to BLm based on the stored data. In addition, during the read or verify operation, the page buffers PB1 to PBm may sense a voltage or a current of the bit lines BL1 to BLm. During the read operation and the verify operation, the page buffers PB1 to PBm perform a sense node precharge operation of precharging each sense node of the page buffers PB1 to PBm to a set potential level. In addition, the page buffers PB1 to PBm may be divided into at least two page buffer groups, and each page buffer group may individually perform the sense node precharge operation. That is, the sense node precharge operation of each of the at least two page buffer groups may be dualized with each other.

The column decoder 240 may transfer data between the input/output circuit 250 and the read/write circuit 230 in response to a column address CADD. For example, the column decoder 240 may exchange data with the page buffers PB1 to PBm through data lines DL, or may exchange data with the input/output circuit 250 through column lines CL.

The input/output circuit 250 may transfer the command CMD and the address ADD received from the memory controller 1200 of FIG. 1 to the control logic 300 or may exchange the data DATA with the column decoder 240.

During the read operation or the verify operation, the pass/fail determiner 260 may generate a reference current in response to a permission bit VRY_BIT<#>, compare a sensing voltage VPB received from the read/write circuit 230 with a reference voltage generated by the reference current, and output a pass signal PASS or a fail signal FAIL.

The source line driver 270 may be connected to the memory cell included in the memory cell array 100 through the source line SL and may control a voltage of a source node. For example, during the read operation or the verify operation, the source line driver 270 may electrically connect the source node of the memory cell to a ground node. In addition, during the program operation, the source line driver 270 may apply a ground voltage to the source node of the memory cell. During the erase operation, the source line driver 270 may apply an erase voltage to the source node of the memory cell. The source line driver 270 may receive a source line control signal CTRL_SL from the control logic 300 and may control the voltage of the source node based on the source line control signal CTRL_SL.

The control logic 300 may output the operation signal OP_CMD, the address RADD, the page buffer control signals PBSIGNALS, and the permission bit VRY_BIT<#> in response to the command CMD and the address ADD to control the peripheral circuits 200. In addition, the control logic 300 may determine whether the verify operation is passed or failed in response to the pass signal PASS or the fail signal FAIL. The control logic 300 may be implemented as hardware, software, or a combination of hardware and software. For example, the control logic 300 may be a control logic circuit operating in accordance with an algorithm and/or a processor executing control logic code.

The control logic 300 may generate page buffer control signals PBSIGNALS including precharge signals for controlling the sense node precharge operation. The respective precharge signals may correspond to the respective page buffer groups of the page buffers PB1 to PBm, and timings at which of the precharge signals are activated may be different from each other.

Figure 3:
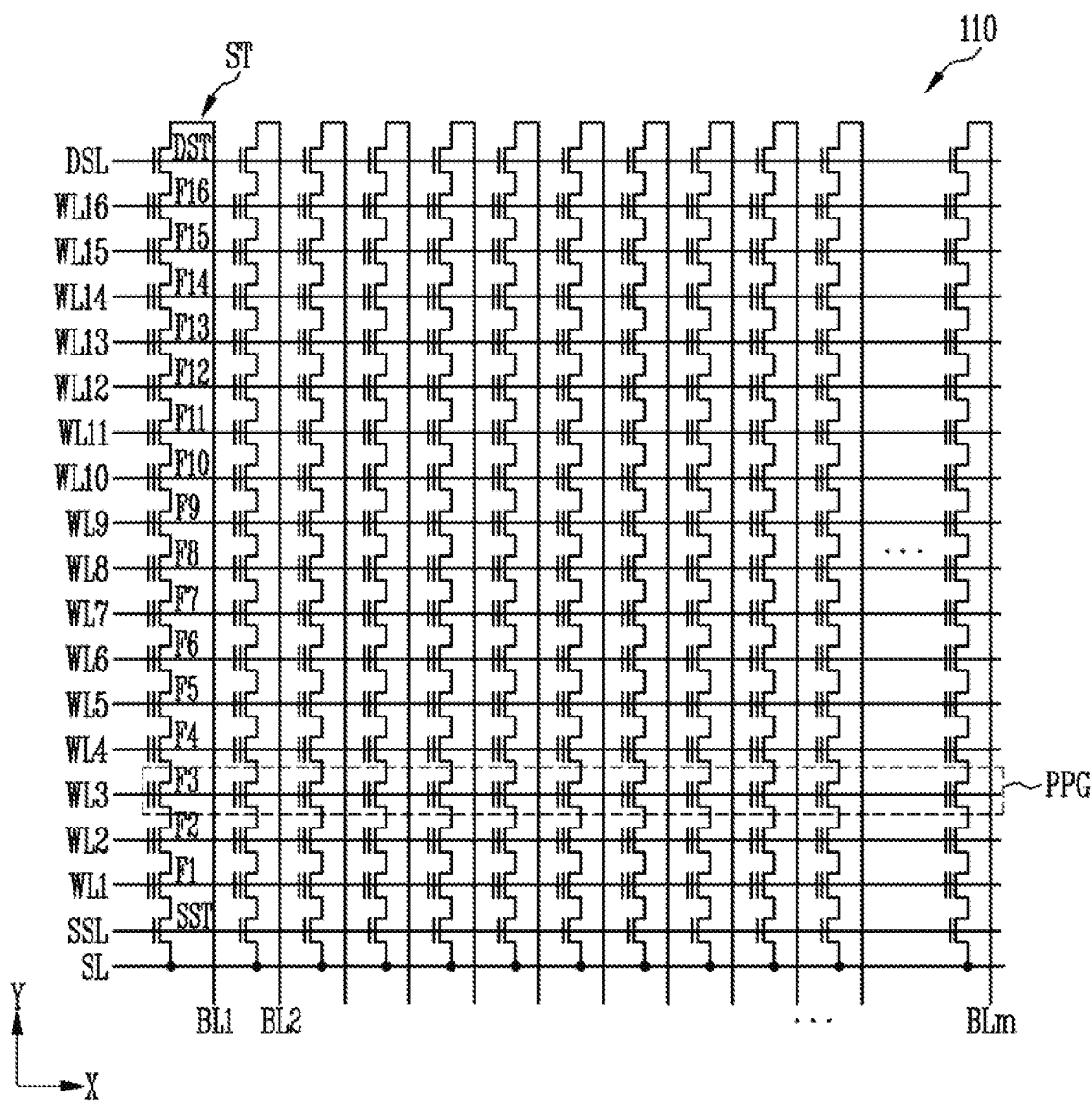
FIG. 3 is a diagram for describing a memory block of FIG. 2.

FIG. 3 is a diagram for describing the memory block 110 of FIG. 2.

Referring to FIG. 3, the memory block 110 may be connected to a plurality of word lines arranged in parallel with each other between the first select line and the second select line. Here, the first select line may be the source select line SSL, and the second select line may be the drain select line DSL. More specifically, the memory block 110 may include a plurality of strings ST connected between the bit lines BL1 to BLm and the source line SL. The bit lines BL1 to BLm may be connected to the strings ST, respectively, and the source line SL may be commonly connected to the strings ST. Because the strings ST may be configured to be identical to each other, a string ST connected to the first bit line BL1 will be specifically described, as an example.

The string ST may include a source select transistor SST, a plurality of memory cells F1 to F16, and a drain select transistor DST connected in series between the source line SL and the first bit line BL1. One string ST may include at least one or more of the source select transistor SST and the drain select transistor DST, and may include the memory cells F1 to F16 more than the number shown in the figure.

A source of the source select transistor SST may be connected to the source line SL and a drain of the drain select transistor DST may be connected to the first bit line BL1. The memory cells F1 to F16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells F1 to F16 may be connected to the plurality of word lines WL1 to WL16. A group of the memory cells connected to the same word line among the memory cells included in different strings ST may be referred to as a page PPG. Therefore, the memory block 11 may include the pages PPG of the number of the word lines WL1 to WL16.

One memory cell may store 1 bit of data. This is commonly called a single level cell (SLC). In this case, one physical page PPG may store one logical page (LPG) data. The one logical page (LPG) data may include data bits of the same number as cells included in one physical page PPG. In addition, one memory cell may store two or more bits of data. This is commonly called a multi-level level cell (MLC). In this case, one physical page PPG may store two or more logical page (LPG) data.

Figure 4:
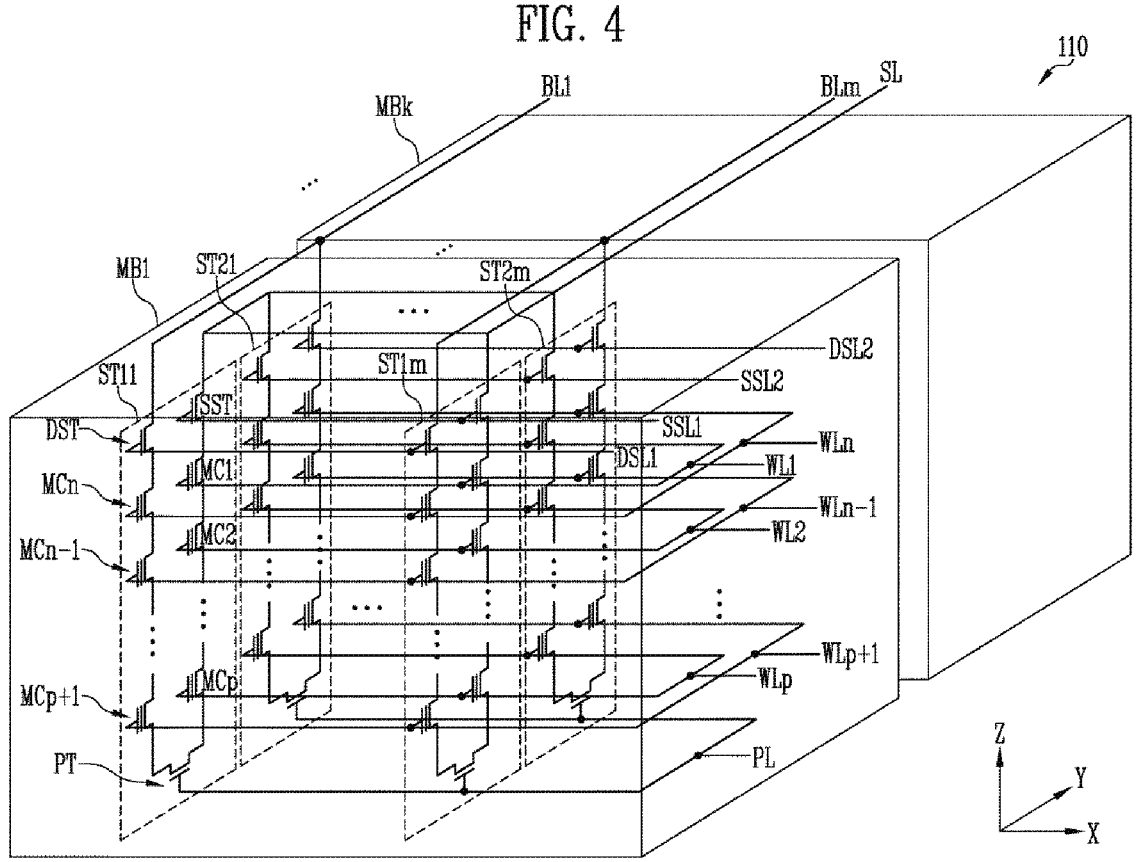
FIG. 4 is a diagram for describing an embodiment of a memory block configured in three dimensions.

FIG. 4 is a diagram for describing an embodiment of a memory block configured in three dimensions.

Referring to FIG. 4, the memory cell array 100 may include a plurality of memory blocks MB1 to MBk; 110. The memory block 110 may include a plurality of strings ST11 to ST1m and ST21 to ST2m. As an embodiment, each of the plurality of strings ST11 to ST1m and ST21 to ST2m may be formed in a 'U' shape. In the first memory block MB1, m strings may be arranged in a row direction (X direction). In FIG. 4, two strings are arranged in a column direction (Y direction), but this is for convenience of description, and three or more strings may be arranged in the column direction (Y direction).

Each of the plurality of strings ST11 to ST1m and ST21 to ST2m may include at least one source select transistor SST, first to n-th memory cells MC1 to MCn, a pipe transistor PT, and at least one drain select transistor DST.

The source and drain select transistors SST and DST and the memory cells MC1 to MCn may have similar structures. For example, each of the source and drain select transistors SST and DST and the memory cells MC1 to MCn may include a channel film, a tunnel insulating film, a charge trap film, and a blocking insulating film. For example, a pillar for providing the channel film may be provided in each string. For example, a pillar for providing at least one of the channel film, the tunnel insulating film, the charge trap film, and the blocking insulating film may be provided in each string.

The source select transistor SST of each string may be connected between the source line SL and the memory cells MC1 to MCp.

As an embodiment, the source select transistors of the strings arranged in the same row may be connected to the source select line extending in the row direction, and the source select transistors of the strings arranged in different rows may be connected to different source select lines. In FIG. 4, the source select transistors of the strings ST11 to ST1m of a first row may be connected to a first source select line SSL1. The source select transistors of the strings ST21 to ST2m of a second row may be connected to a second source select line SSL2.

As another embodiment, the source select transistors of the strings ST11 to ST1m and ST21 to ST2m may be commonly connected to one source select line.

The first to n-th memory cells MC1 to MCn of each string may be connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp may be sequentially arranged in a vertical direction (Z direction), and may be connected in series between the source select transistor SST and the pipe transistor PT. The (p+1)-th to n-th memory cells MCp+1 to MCn may be sequentially arranged in the vertical direction (Z direction), and may be connected in series between the pipe transistor PT and the drain select transistor DST. The first to p-th memory cells MC1 to MCp and the (p+1)-th to n-th memory cells MCp+1 to MCn may be connected to each other through the pipe transistor PT. Gates of the first to n-th memory cells MC1 to MCn of each string may be connected to the first to the n-th word lines WL1 to WLn, respectively.

As an embodiment, at least one of the first to n-th memory cells MC1 to MCn may be used as a dummy memory cell. When the dummy memory cell is provided, a voltage or a current of a corresponding string may be stably controlled. A gate of the pipe transistor PT of each string may be connected to the pipeline PL.

The drain select transistor DST of each string may be connected between the bit line and the memory cells MCp+1 to MCn. The strings arranged in the row direction may be connected to the drain select line extending in the row direction. The drain select transistors of the strings ST11 to ST1m of the first row may be connected to a first drain select line DSL1. The drain select transistors of the strings ST21 to ST2m of the second row may be connected to a second drain select line DSL2.

The strings arranged in the column direction may be connected to the bit lines extending in the column direction. In FIG. 4, the strings ST11 and ST21 of a first column may be connected to the first bit line BL1. The strings ST1m and ST2m of an m-th column may be connected to the m-th bit line BLm.

Among the strings arranged in the row direction, the memory cells connected to the same word line may configure one page. For example, the memory cells connected to the first word line WL1 among the strings ST11 to ST1m of the first row may configure one page. The memory cells connected to the first word line WL1 among the strings ST21 to ST2m of the second row may configure another page. The strings arranged in one row direction will be selected by selecting any one of the drain select lines DSL1 and DSL2. One page of the selected strings will be selected by selecting any one of the word lines WL1 to WLn.

Figure 5:
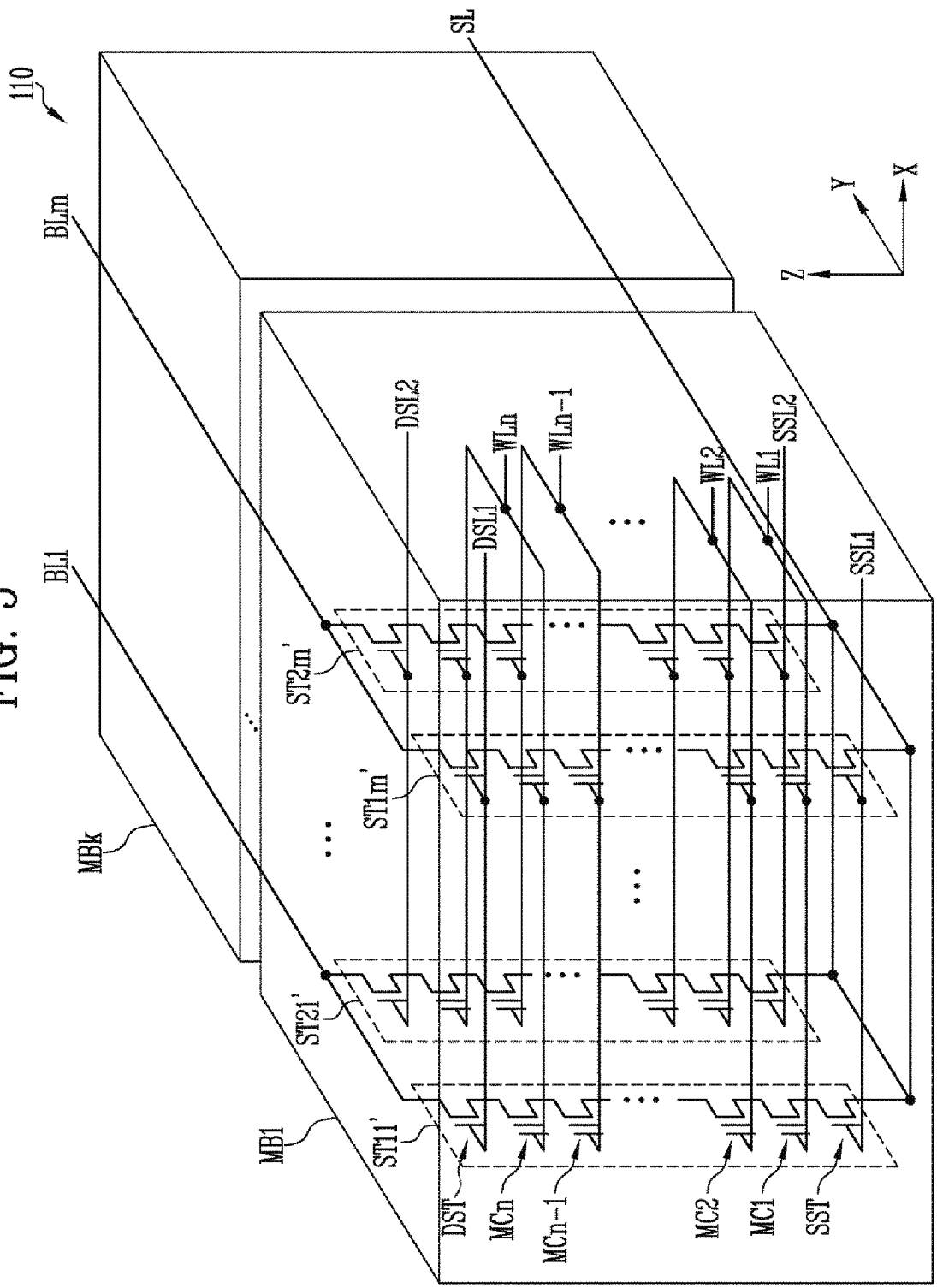
FIG. 5 is a diagram for describing another embodiment of the memory block configured in three dimensions.

FIG. 5 is a diagram for describing another embodiment of a memory block configured in three dimensions.

Referring to FIG. 5, the memory cell array 100 may include a plurality of memory blocks MB1 to MBk; 110. The memory block 110 may include a plurality of strings ST11' to ST1m' and ST21' to ST2m'. Each of the plurality of strings ST11' to ST1m' and ST21' to ST2m' may be extended along the vertical direction (Z direction). In the memory block 110, m strings may be arranged in the row direction (X direction). In FIG. 5, two strings are arranged in the column direction (Y direction), but this is for convenience of description, and three or more strings may be arranged in the column direction (Y direction).

Each of the plurality of strings ST11' to ST1m' and ST21' to ST2m' may include at least one source select transistor SST, first to n-th memory cells MC1 to MCn, and at least one drain select transistor DST.

The source select transistor SST of each string may be connected between the source line SL and the memory cells MC1 to MCn. The source select transistors of the strings arranged in the same row may be connected to the same source select line. The source select transistors of the strings ST11' to ST1m' arranged in the first row may be connected to a first source select line SSL1. The source select transistors of the strings ST21' to ST2m' arranged in the second row may be connected to a second source select line SSL2. As another embodiment, the source select transistors of the strings ST11' to ST1m' and ST21' to ST2m' may be commonly connected to one source select line.

The first to n-th memory cells MC1 to MCn of each string may be connected to each other in series between the source select transistor SST and the drain select transistor DST. Gates of the first to n-th memory cells MC1 to MCn may be connected to the first to n-th word lines WL1 to WLn, respectively.

As an embodiment, at least one of the first to n-th memory cells MC1 to MCn may be used as a dummy memory cell. When the dummy memory cell is provided, a voltage or a current of a corresponding string may be stably controlled. Therefore, reliability of the data stored in the memory block 110 may be improved.

The drain select transistor DST of each string may be connected between the bit line and the memory cells MC1 to MCn. The drain select transistors DST of the strings arranged in the row direction may be connected to the drain select line extending in the row direction. The drain select transistors DST of the strings ST11' to ST1m' of the first row may be connected to a first drain select line DSL1. The drain select transistors DST of the strings ST21' to ST2m' of the second row may be connected to a second drain select line DSL2.

That is, the memory block 110 of FIG. 5 may have an equivalent circuit similar to the memory block 110 of FIG. 4 except that the pipe transistor PT is excluded from each string.

Figure 6:
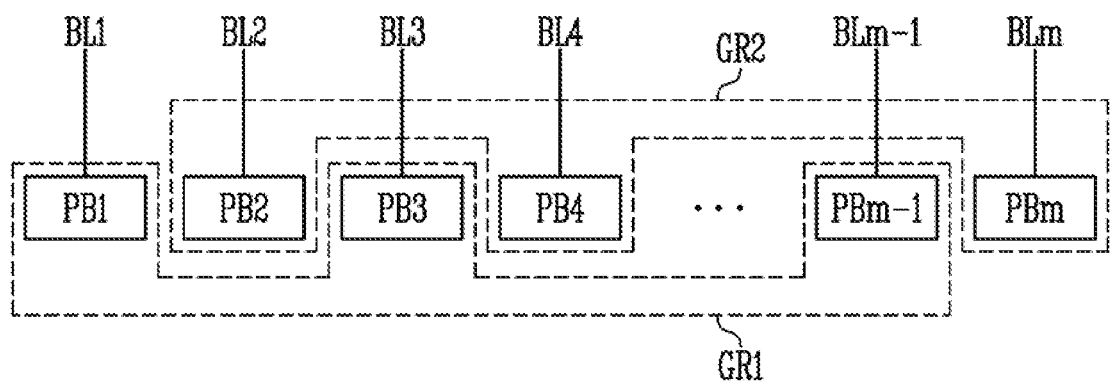
FIG. 6 is a diagram for describing a page buffer group included in a read/write circuit according to an embodiment of the present disclosure.

FIG. 6 is a diagram for describing the page buffer group included in the read/write circuit according to an embodiment of the present disclosure.

Referring to FIG. 6, the plurality of page buffers PB1 to PBm may be divided into a plurality of page buffer groups GR1 and GR2.

For example, the plurality of page buffers PB1 to PBm may be sequentially arranged. Among the plurality of page buffers PB1 to PBm, odd-numbered page buffers (for example, PB1, PB3, . . . , and PBm−1) may be defined as the first page buffer group GR1, and even-numbered page buffers (for example, PB2, PB4, . . . , and PBm) may be defined as the second page buffer group GR2. The page buffers included in the first page buffer group GR1 and the page buffers included in the second page buffer group GR2 may be arranged to cross each other.

Figure 7:
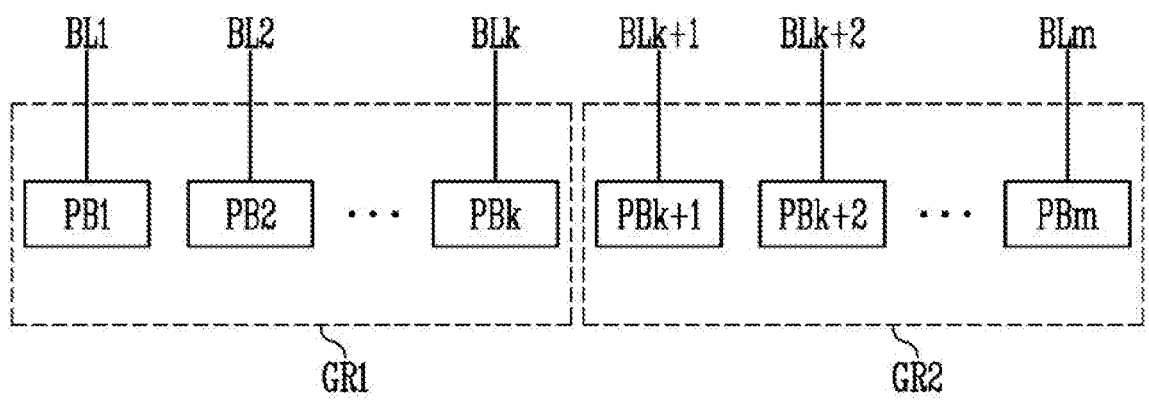
FIG. 7 is a diagram for describing the page buffer group included in the read/write circuit according to another embodiment of the present disclosure.

FIG. 7 is a diagram for describing the page buffer group included in the read/write circuit according to another embodiment of the present disclosure.

Referring to FIG. 7, the plurality of page buffers PB1 to PBm may be divided into a plurality of page buffer groups GR1 and GR2.

For example, the plurality of page buffers PB1 to PBm may be sequentially arranged. Among the plurality of page buffers PB1 to PBm, a first page buffer PB1 to a k-th page buffer PBk may be defined as the first page buffer group GR1, and (k+1)-th page buffer PBk+1 to the last page buffer PBm may be defined as the second page buffer group GR2. The number of page buffers included in the first page buffer group GR1 and the number of page buffers included in the second page buffer group GR2 may be the same.

In an embodiment of the present disclosure, it has been described that the plurality of page buffers PB1 to PBm are defined as two page buffer groups as an example, but is not limited thereto, and the plurality of page buffers PB1 to PBm may be defined as two or more page buffer groups.

The first page buffer group GR1 and the second page buffer group GR2 described above with reference to FIGS. 6 and 7 may perform the sense node precharge operation in response to different precharge signals. For example, the page buffers included in the first page buffer group GR1 may perform the sense node precharge operation in response to an odd precharge signal, and the page buffers included in the second page buffer group GR2 may perform the sense node precharge operation in response to an even precharge signal. Timing at which activations of the odd precharge signal and the even precharge signal are started may be different from each other, and timings at which the activations are ended may be identical to each other. This will be described later in detail.

Figure 8:
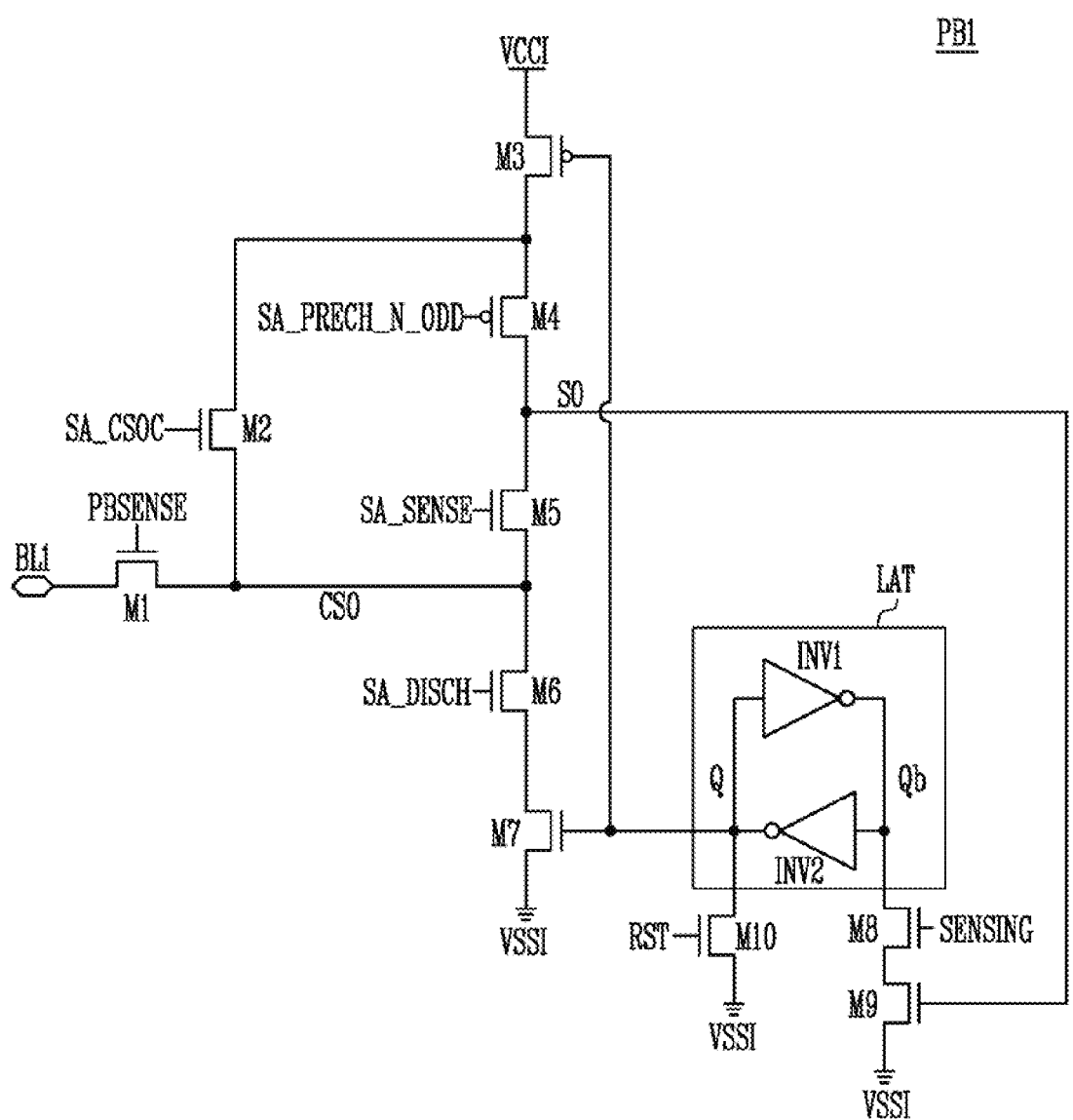
FIG. 8 is a diagram for describing a page buffer included in a first page buffer group according to an embodiment of the present disclosure.

FIG. 8 is a diagram for describing the page buffer included in the first page buffer group according to an embodiment of the present disclosure.

In FIG. 8, a first page buffer PB1 among the page buffers included in the first page buffer group GR1 of FIG. 6 or 7 will be described as an example. The page buffers included in the first page buffer group GR1 may be designed in a structure similar to each other.

Referring to FIG. 8, the first page buffer PB1 may be connected to the memory cell through the bit line BL1, and may perform a bit line precharge operation of charging a charge supplied from a power voltage VCCI to the bit line BL1 through first to fifth transistors M1 to M5. At this time, the first transistor M1 is controlled by a first sense signal PBSENSE, the second transistor M2 is controlled by a first precharge signal SA_CSOC, and the third transistor M3 is controlled by a storage LAT. In addition, the fourth transistor M4 is controlled by an odd precharge signal SA_PRECH_N_ODD, and the fifth transistor M5 is controlled by a second sense signal SA_SENSE. The storage LAT may be configured as a latch or a fuse.

In addition, the first page buffer PB1 may perform a sense node precharge (SO precharge) operation of charging the charge supplied from the power voltage VCCI to a sense node SO through the third transistor M3 and the fourth transistor M4. At this time, the third transistor M3 is controlled by the storage LAT, and the fourth transistor M4 is controlled by the odd precharge signal SA_PRECH_N_ODD.

In addition, the first page buffer PB1 may discharge the charge, which is charged in the bit line BL1, to a ground voltage VSSI through the first transistor M1, a sixth transistor M6, and a seventh transistor M7. The sixth transistor M6 is controlled by a first discharge signal SA_DISCH, and the seventh transistor M7 is controlled by the storage LAT.

The first page buffer PB1 may include the storage LAT including a first inverter INV1 and a second inverter INV2. The storage LAT may turn on or turn off the third transistor M3 through a first node Q to control the bit line precharge operation and the sense node precharge (SO precharge) operation. A second node Qb and the first node Q have inverted values. During a sensing operation of the memory cell connected to the bit line BL1, a voltage of the sense node SO is determined based on a threshold voltage of the memory cell. For example, a voltage of the bit line BL1 may be determined based on the threshold voltage of the memory cell. At this time, when the first and fifth transistors M1 and M5 are turned on, because the bit line BL1 and the sense node SO are connected to each other through a common node CSO, the voltage of the sense node SO may be determined based on the threshold voltage of the memory cell. The storage LAT may store a result of sensing the threshold voltage of the memory cell through an eighth transistor M8 and a ninth transistor M9 connected between the second node Qb the ground voltage VSSI. During the sensing operation, the eighth transistor M8 is turned on according to the sensing signal SENSING applied at a high level. According to the ninth transistor M9 turned on or off according to a potential level of the sense node SO, the second node Qb maintains a high level that is an initial state or is changed to a low level state to latch data corresponding to the potential level of the sense node SO. When the threshold voltage of the memory cell is low, during the sensing operation, the sense node SO may become a low level, and the ninth transistor M9 may be turned off. When the threshold voltage of the memory cell is high, during the sensing operation, the sense node SO may become a high level, and the ninth transistor M9 may be turned on. A tenth transistor M10 may be controlled by a reset signal RST to initialize the first node Q to a level of the ground voltage VSSI.

Figure 9:
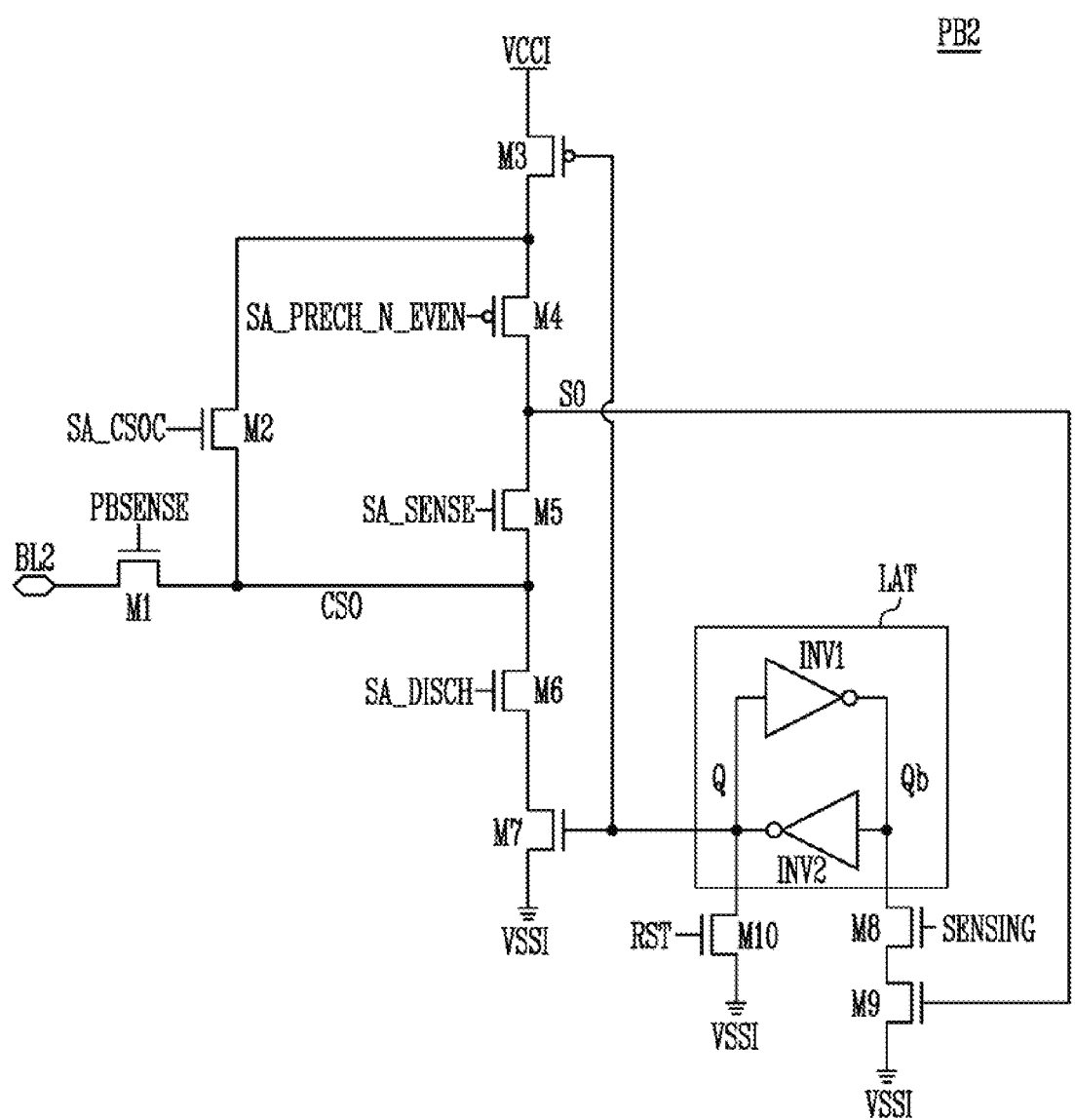
FIG. 9 is a diagram for describing a page buffer included in a second page buffer group according to an embodiment of the present disclosure.

FIG. 9 is a diagram for describing the page buffer included in the second page buffer group according to an embodiment of the present disclosure.

In FIG. 9, a second page buffer PB2 among the page buffers included in the second page buffer group GR2 of FIG. 6 will be described as an example. The page buffers included in the second page buffer group GR2 may be designed in a structure similar to each other.

Referring to FIG. 9, the second page buffer PB2 may be connected to the memory cell through the bit line BL2, and may perform a bit line precharge operation of charging a charge supplied from the power voltage VCCI to the bit line BL2 through first to fifth transistors M1 to M5. At this time, the first transistor M1 is controlled by a first sense signal PBSENSE, the second transistor M2 is controlled by a first precharge signal SA_CSOC, and the third transistor M3 is controlled by a storage LAT. In addition, the fourth transistor M4 is controlled by an even precharge signal SA_PRECH_N_EVEN, and the fifth transistor M5 is controlled by a second sense signal SA_SENSE. The storage LAT may be configured as a latch or a fuse.

In addition, the second page buffer PB2 may perform a sense node precharge (SO precharge) operation of charging the charge supplied from the power voltage VCCI to a sense node SO through the third transistor M3 and the fourth transistor M4. At this time, the third transistor M3 is controlled by the storage LAT, and the fourth transistor M4 is controlled by the even precharge signal SA_PRECH_N_EVEN.

In addition, the second page buffer PB2 may discharge the charge, which is charged in the bit line BL2, to a ground voltage VSSI through the first transistor M1, a sixth transistor M6, and a seventh transistor M7. The sixth transistor M6 is controlled by a first discharge signal SA_DISCH, and the seventh transistor M7 is controlled by the storage LAT.

The second page buffer PB2 may include the storage LAT including a first inverter INV1 and a second inverter INV2. The storage LAT may turn on or turn off the third transistor M3 through a first node Q to control the bit line precharge operation and the sense node precharge (SO precharge) operation. A second node Qb and the first node Q have inverted values. During a sensing operation of the memory cell connected to the bit line BL2, a voltage of the sense node SO is determined based on a threshold voltage of the memory cell. For example, a voltage of the bit line BL2 may be determined based on the threshold voltage of the memory cell. At this time, when the first and fifth transistors M1 and M5 are turned on, because the bit line BL2 and the sense node SO are connected to each other through a common node CSO, the voltage of the sense node SO may be determined based on the threshold voltage of the memory cell. The storage LAT may store a result of sensing the threshold voltage of the memory cell through an eighth transistor M8 and a ninth transistor M9 connected between the second node Qb and the ground voltage VSSI. During the sensing operation, the eighth transistor M8 is turned on according to the sensing signal SENSING applied at a high level. According to the ninth transistor M9 turned on or off according to a potential level of the sense node SO, the second node Qb maintains a high level that is an initial state or is changed to a low level state to latch data corresponding to the potential level of the sense node SO. When the threshold voltage of the memory cell is low, during the sensing operation, the sense node SO may become a low level, and the ninth transistor M9 may be turned off. When the threshold voltage of the memory cell is high, during the sensing operation, the sense node SO may become a high level, and the ninth transistor M9 may be turned on. A tenth transistor M10 may be controlled by a reset signal RST to initialize the first node Q to a level of the ground voltage VSSI.

As described above, the page buffers included in the second page buffer group may be designed such that the precharge signal applied to the fourth transistor M4 of the page buffers included in the second page buffer group is different from the precharge signal applied to the fourth transistor M4 of the page buffers included in the first page buffer group. That is, the page buffers included in the first page buffer group may be controlled by the odd precharge signal SA_PRECH_N_ODD, and the page buffers included in the second page buffer group may be controlled by the even precharge signal SA_PRECH_N_EVEN. Accordingly, because the first page buffer group and the second page buffer group perform the sense node precharge operation according to the odd precharge signal SA_PRECH_N_ODD and the even precharge signal SA_PRECH_N_EVEN of which activation timings are different from each other, the first page buffer group and the second page buffer group may be dualized and operate such that the activation timing of the sense node precharge operation of the first page buffer group and the activation timing of the sense node precharge operation of the second page buffer group are different from each other.

Figure 10:
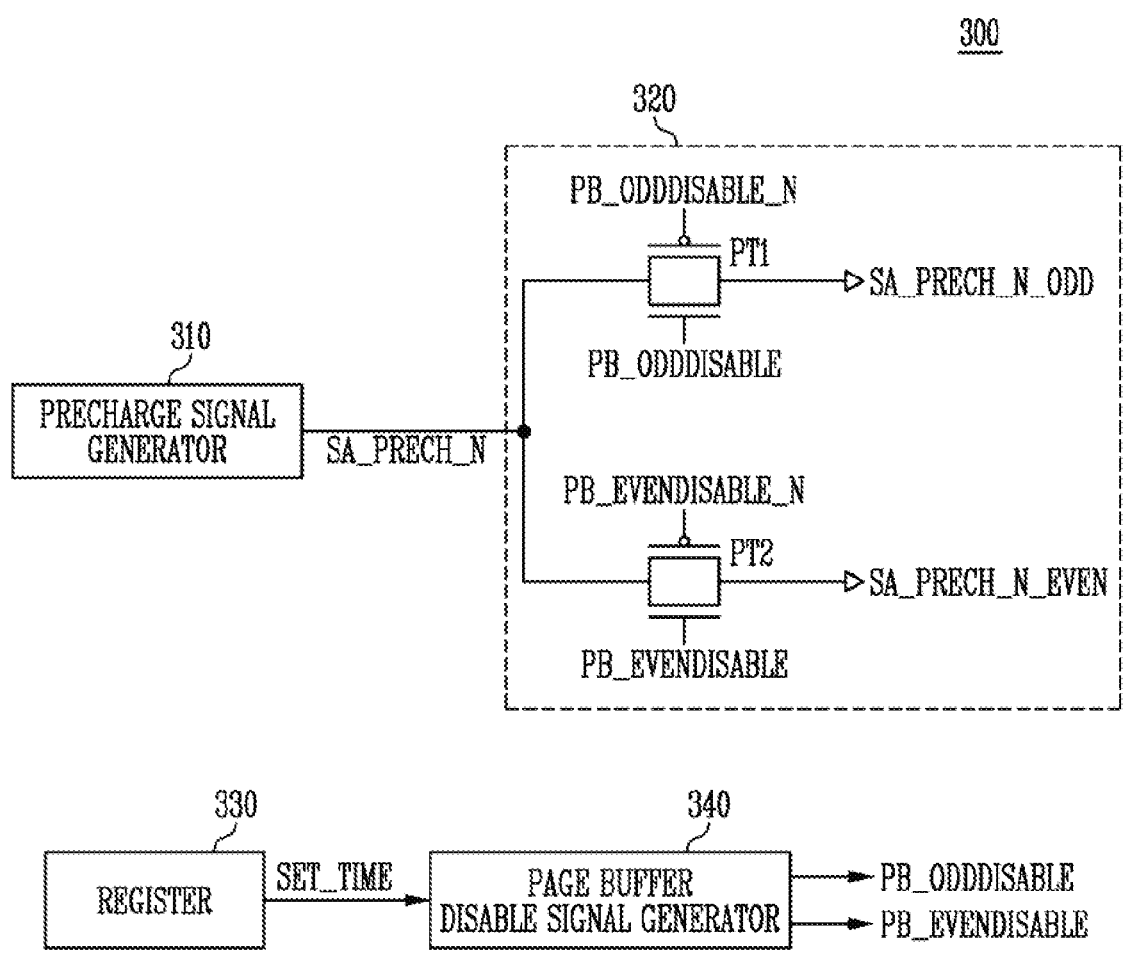
FIG. 10 is a diagram for describing control logic of FIG. 2.

FIG. 10 is a diagram for describing the control logic 300 of FIG. 2.

Referring to FIG. 10, the control logic 300 may include a precharge signal generator 310, a precharge signal divider 320, a register 330, and a page buffer disable signal generator 340.

The precharge signal generator 310 generates a precharge signal SA_PRECH_N during the bit line precharge operation and the sense node precharge operation. The precharge signal SA_PRECH_N is a signal that is activated at a logic low level.

The precharge signal divider 320 outputs the precharge signal SA_PRECH_N received from the precharge signal generator 310 as the odd precharge signal SA_PRECH_N_ODD and the even precharge signal SA_PRECH_N_EVEN.

The precharge signal divider 320 may include a first pass transistor PT1 and a second pass transistor PT2.

The first pass transistor PT1 may receive the precharge signal SA_PRECH_N, and may output the received precharge signal SA_PRECH_N as the odd precharge signal SA_PRECH_N_ODD to the first page buffer group GR1 of FIG. 6 or 7. In addition, during the sense node precharge operation, the first pass transistor PT1 may control a timing at which the received precharge signal SA_PRECH_N is output as the odd precharge signal SA_PRECH_N_ODD, in response to an odd disable signals PB_ODDDISABLE and PB_ODDDISABLE_N. That is, the first pass transistor PT1 may control the timing at which the odd precharge signal SA_PRECH_N_ODD is activated, in response to the odd disable signals PB_ODDDISABLE and PB_ODDDISABLE_N.

The second pass transistor PT2 may receive the precharge signal SA_PRECH_N, and may output the received precharge signal SA_PRECH_N as the even precharge signal SA_PRECH_N_EVEN to the second page buffer group GR2 of FIG. 6 or 7. In addition, during the sense node precharge operation, the second pass transistor PT2 may control a timing at which the received precharge signal SA_PRECH_N is output as the even precharge signal SA_PRECH_N_EVEN, in response to an even disable signals PB_EVENDISABLE and PB_EVENDISABLE_N. That is, the second pass transistor PT2 may control the timing at which the even precharge signal SA_PRECH_N_EVEN is activated, in response to the even disable signals PB_EVENDISABLE and PB_EVENDISABLE_N.

During the sense node precharge operation, the activation timings of the first pass transistor PT1 and the second pass transistor PT2 may be different from each other. For example, the first pass transistor PT1 may be activated to start transmitting the odd precharge signal SA_PRECH_N_ODD to the first page buffer group GR1, and then the second pass transistor PT2 may be activated to transmit the even precharge signal SA_PRECH_N_EVEN to the second page buffer group GR2.

The register 330 may store a set time SET_TIME corresponding to a time difference value between an activation start timing of the sense node precharge operation of the first page buffer group and an activation start timing of the sense node precharge operation of the second page buffer group. During the sense node precharge operation of the read operation or the verify operation, the register 330 may output the stored set time SET_TIME.

The set time SET_TIME may be changed according to a user's setting. An optimal time at which current consumption is distributed during the sense node precharge operation of the first page buffer group and the second page buffer group may be defined as the set time SET_TIME.

The page buffer disable signal generator 340 may generate the odd disable signal PB_ODDDISABLE and the even disable signal PB_EVENDISABLE in response to the set time SET_TIME received from the register 330 and output the odd disable signal PB_ODDDISABLE and the even disable signal PB_EVENDISABLE to the signal divider 320. The odd disable signal PB_ODDDISABLE_N is a signal that inverts the odd disable signal PB_ODDDISABLE, and the even disable signal PB_EVENDISABLE_N is a signal that inverts the even disable signal PB_EVENDISABLE. For example, the page buffer disable signal generator 340 may activate the odd disable signal PB_ODDDISABLE or the even disable signal PB_EVENDISABLE by a time corresponding to the set time SET_TIME in a sense node precharge operation period and output the odd disable signal PB_ODDDISABLE or the even disable signal PB_EVENDISABLE.

Figure 11:
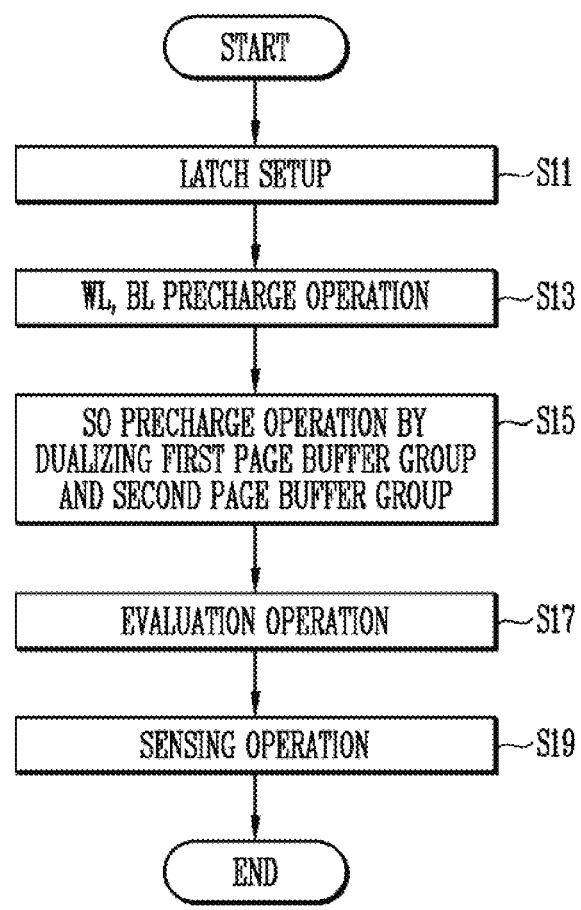
FIG. 11 is a flowchart for describing a read operation of the memory device according to an embodiment of the present disclosure.

FIG. 11 is a flowchart for describing the read operation of the memory device according to an embodiment of the present disclosure.

Figure 12:
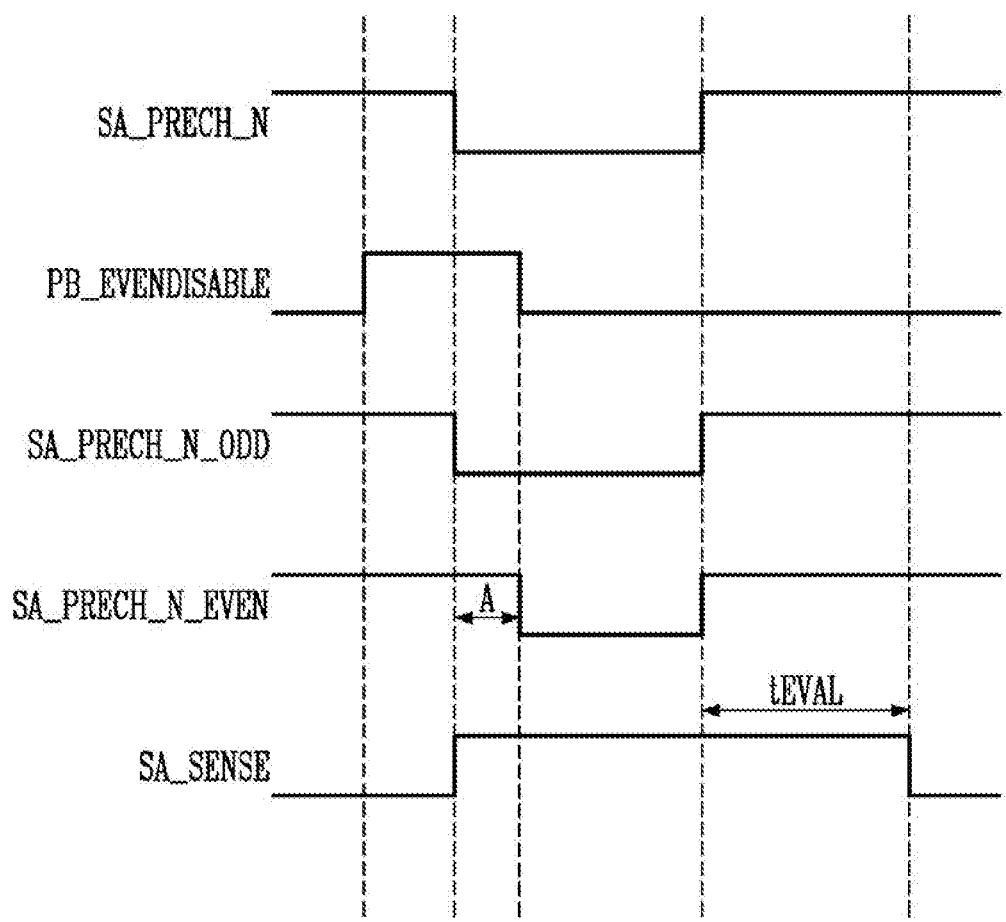
FIG. 12 is a waveform diagram of signals for describing an operation of the page buffer during a sense node precharge operation of FIG. 11.

FIG. 12 is a waveform diagram of signals for describing an operation of the page buffer during the sense node precharge operation of FIG. 11.

The read operation of the memory device according to an embodiment of the present disclosure will be described with reference to FIGS. 2 to 12 as follows.

In step S11, the storage LAT of each of the page buffers PB1 to PBm included in the read/write circuit 230 is set up. During a setup operation, a reset signal RST of a logic high level is applied to each of the first page buffer group GR1 and the second page buffer group GR2. The tenth transistor M10 of each of the page buffers PB1 to PBm is turned on in response to the reset signal RST of the logic high level, and thus, the first node Q of each of the page buffers PB1 to PBm is initialized to the level of the ground voltage VSSI.

In step S13, the peripheral circuits 200 precharge a potential level of the word lines of the selected memory block (for example, MB1) to the read voltage and the pass voltage, and precharge the bit lines BL1 to BLm of the selected memory block MB1 to a set level.

For example, during the read operation, the voltage generation circuit 210 generates the read voltage and the pass voltage used for the read operations in response to the operation signal OP_CMD. The row decoder 220 transfers the read voltage and the pass voltage to the local lines LL connected to the selected memory block MB1 in response to the row address RADD. For example, the row decoder 220 precharges the potential level of the word lines by applying the read voltage to the selected word line among the local lines LL and applying the pass voltage to the non-selected word lines.

The plurality of page buffers PB1 to PBm included in the read/write circuit 230 precharge corresponding bit lines BL1 to BLm. During the bit line precharge operation, each of the plurality of page buffers PB1 to PBm may charge supplied from the power voltage VCCI through the first to fifth transistors M1 to M5 to the corresponding bit line. For example, the first transistor M1 is turned on by the first sense signal PBSENSE, the second transistor M2 is turned on by the first precharge signal SA_CSOC, the third transistor M3 is turned on according to the potential level of the first node Q initially set to a low level, the fourth transistor M4 is turned on by the odd precharge signal SA_PRECH_N_ODD or the even precharge signal SA_PRECH_N_EVEN, and the fifth transistor M5 is turned on by the second sense signal SA_SENSE, to precharge the bit lines BL1 to BLm.

In step S15, the page buffers (for example, PB1, PB3, . . . , and PBm−1) included in the first page buffer group GR1 and the page buffers (for example, PB2, PB4, . . . , and PBm) included in the second page buffer group GR2 may be dualized and the sense node precharge operation is performed.

For example, the first pass transistor PT1 of the precharge signal divider 320 is activated in response to the odd disable signals PB_ODDDISABLE and PB_ODDDISABLE_N, and the second pass transistor PT2 is deactivated in response to the even disable signals PB_EVENDISABLE and PB_EVENDISABLE_N. The precharge signal generator 310 generates and outputs the precharge signal SA_PRECH_N of a low level during the sense node precharge operation. Therefore, the precharge signal divider 320 first outputs the odd precharge signal SA_PRECH_N_ODD activated at the logic low level.

The third transistor M3 of the page buffers PB1, PB3, . . . , and PBm−1 included in the first page buffer group GR1 is turned on according to the potential level of the first node Q1, which is initially set to a low level, and the fourth transistor M4 is turned on by the odd precharge signal SA_PRECH_N_ODD, to precharge the sense node SO of each of the page buffers PB1, PB3, . . . , and PBm−1.

After the set time A, the second pass transistor PT2 of the precharge signal divider 320 is activated in response to the even disable signals PB_EVENDISABLE and PB_EVENDISABLE_N. Accordingly, the precharge signal divider 320 outputs the even precharge signal SA_PRECH_N_EVEN activated at a logic low level.

The third transistor M3 of the page buffers PB2, PB4, . . . , and PBm included in the second page buffer group GR2 is turned on according to the potential level of the first node Q1, which is initially set to a low level, and the fourth transistor M4 is turned on by the even precharge signal SA_PRECH_N_EVEN, to precharge the sense node SO of each of the page buffers PB2, PB4, . . . , and PBm.

As described above, the first page buffer group GR1 and the second page buffer group GR2 start the sense node precharge operation at timings different from each other.

Thereafter, the precharge signal generator 310 transits the precharge signal SA_PRECH_N of a low level to a logic high level. Therefore, the first page buffer group GR1 and the second page buffer group GR2 end the sense node precharge operation at the same timing.

In step S17, the first page buffer group GR1 and the second page buffer group GR2 perform an evaluation operation for a predetermined time tEVAL after the sense node precharge operation is ended.

When the read voltage is applied to the selected word line, the current amount flowing through the bit lines BL1 to BLm changes according to data stored in memory cells connected to the selected word line, and thus, the potential level of the sense node SO of each of the page buffers PB1 to PBm is controlled. For example, the potential level of the sense node SO of each of the page buffers PB1 to PBm changes according to whether the memory cells connected to the selected word line are off cells that are in a program state higher than the read voltage or off cells that are lower than the read voltage. When the memory cell connected to the selected word line is the off cell, the bit line precharged to a high level maintains a precharge level. On the other hand, when the memory cell connected to the selected word line is an on cell, a current continuously flows through the bit line, and the bit line precharged to the high level is gradually discharged to a low level. The evaluation operation is ended when the second sense signal SA_SENSE applied to the page buffers PB1 to PBm transits to a low level.

As described above, the first page buffer group GR1 and the second page buffer group GR2 end the sense node precharge operation at the same timing, and an end timing of the evaluation operation is the same according to the second sense signal SA_SENSE. That is, the first page buffer group GR1 and the second page buffer group GR2 perform an evaluation period for the same time.

In step S19, the first page buffer group GR1 and the second page buffer group GR2 perform the sensing operations to latch data.

For example, when the threshold voltage of the memory cell is programmed to be higher than the read voltage, the potential level of the sense node SO maintains the precharge level of the power voltage VCCI level. Therefore, the ninth transistor M9 is turned on. Thereafter, the eighth transistor M8 is turned on according to the sensing signal SENSING applied at the high level during the sensing operation, and thus, the second node Qb is changed from a high level, which is an initial state, to a low level. In addition, the first node Q is changed from a low level, which is an initial state, to a high level.

When the threshold voltage of the memory cell is lower than the read voltage, the potential level of the sense node SO falls to a low level according to the potential level of the bit line discharged to the ground voltage level. Therefore, the ninth transistor M9 is turned off. Accordingly, even though the eighth transistor M8 is turned on according to the sensing signal SENSING applied at the high level during the sensing operation, the second node Qb maintains a high level, which is an initial state, and the first node Q maintains a low level, which is an initial state.

As described above, according to an embodiment of the present disclosure, during the sense node precharge operation performed in response to the first node Q of the storage LAT and the precharge signal, the plurality of page buffers PB1 to PBm may be divided into at least two page buffer groups, and the sense node precharge operation may be dualized and performed for each page buffer group. Therefore, a voltage and current drop phenomenon of the memory device due to the sense node precharge operation may be improved.

In an embodiment of the present disclosure, the read operation is described as an example, but an embodiment of the present disclosure may be applied to the verify operation performed during the program operation. For example, in the verify operation, during the sense node precharge operation performed in response to the first node Q of the storage LAT and the precharge signal, the plurality of page buffers PB1 to PBm may be divided into at least two page buffer groups, and the sense node precharge operation may be dualized and performed for each page buffer group.

Figure 13:
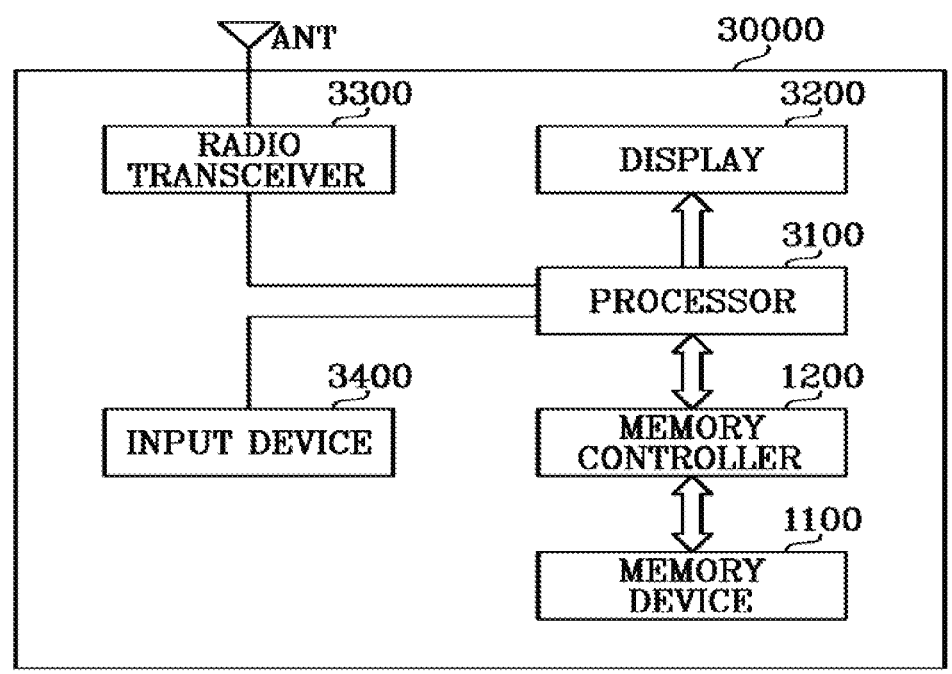
FIG. 13 is a diagram for describing another embodiment of the memory system including the memory device shown in FIG. 2.

FIG. 13 is a diagram for describing another embodiment of a memory system including the memory device shown in FIG. 2.

Referring to FIG. 13, the memory system 30000 may be implemented as a cellular phone, a smart phone, a tablet PC, a personal digital assistant (PDA) or a wireless communication device. The memory system 30000 may include the memory device 1100 and the memory controller 1200 capable of controlling the operation of the memory device 1100. The memory controller 1200 may control a data access operation, for example, a program operation, an erase operation, or a read operation, of the memory device 1100 under control of a processor 3100.

Data programmed in the memory device 1100 may be output through a display 3200 under the control of the memory controller 1200.

A radio transceiver 3300 may transmit and receive a radio signal through an antenna ANT. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the memory controller 1200 or the display 3200. The memory controller 1200 may program the signal processed by the processor 3100 to the memory device 1100. In addition, the radio transceiver 3300 may convert a signal output from the processor 3100 into a radio signal, and output the converted radio signal to an external device through the antenna ANT. An input device 3400 may be a device capable of inputting a control signal for controlling the operation of the processor 3100 or data to be processed by the processor 3100. The input device 3400 may be implemented as a pointing device such as a touch pad or a computer mouse, a keypad, or a keyboard. The processor 3100 may control an operation of the display 3200 so that data output from the memory controller 1200, data output from the radio transceiver 3300, or data output from the input device 3400 is output through the display 3200.

According to an embodiment, the memory controller 1200 capable of controlling the operation of memory device 1100 may be implemented as a part of the processor 3100 and may also be implemented as a chip separate from the processor 3100.

Figure 14:
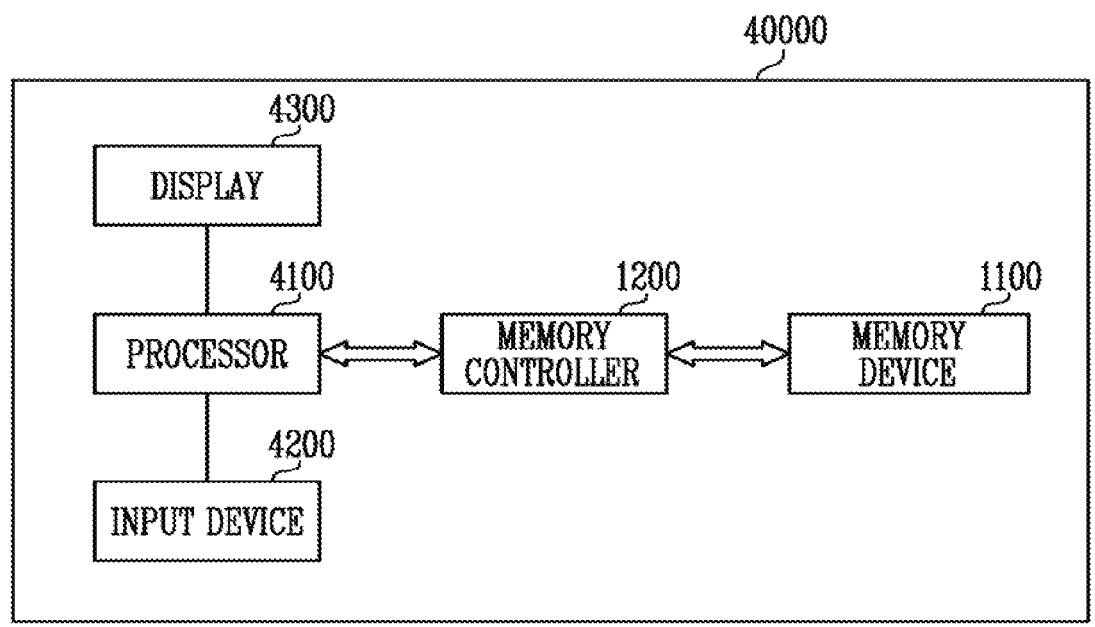
FIG. 14 is a diagram for describing another embodiment of the memory system including the memory device shown in FIG. 2.

FIG. 14 is a diagram for describing another embodiment of a memory system including the memory device shown in FIG. 2.

Referring to FIG. 14, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 capable of controlling a data process operation of the memory device 1100.

A processor 4100 may output data stored in the memory device 1100 through a display 4300, according to data input through an input device 4200. For example, the input device 4200 may be implemented as a point device such as a touch pad or a computer mouse, a keypad, or a keyboard.

The processor 4100 may control the overall operation of the memory system 40000 and control the operation of the memory controller 1200. According to an embodiment, the memory controller 1200 capable of controlling the operation of memory device 1100 may be implemented as a part of the processor 4100 or may be implemented as a chip separate from the processor 4100.

Figure 15:
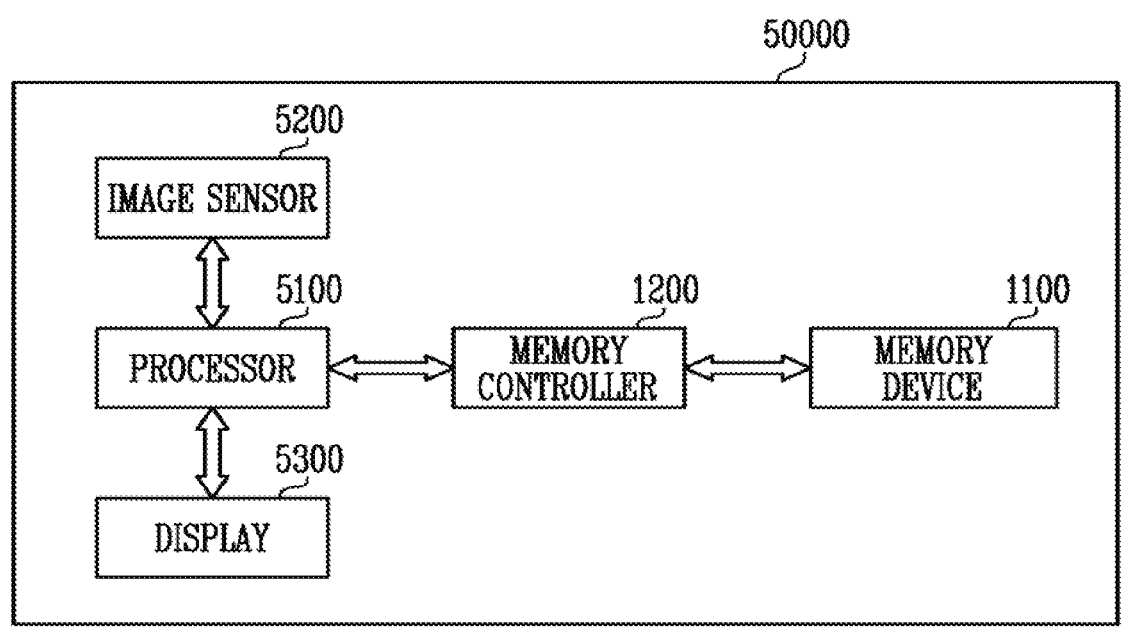
FIG. 15 is a diagram for describing another embodiment of the memory system including the memory device shown in FIG. 2.

FIG. 15 is a diagram for describing another embodiment of a memory system including the memory device shown in FIG. 2.

Referring to FIG. 15, the memory system 50000 may be implemented as an image processing device, for example, a digital camera, a portable phone provided with a digital camera, a smart phone provided with a digital camera, or a tablet PC provided with a digital camera.

The memory system 50000 includes the memory device 1100 and the memory controller 1200 capable of controlling a data process operation, for example, a program operation, an erase operation, or a read operation, of the memory device 1100.

An image sensor 5200 of the memory system 50000 may convert an optical image into digital signals. The converted digital signals may be transmitted to a processor 5100 or the memory controller 1200. Under control of the processor 5100, the converted digital signals may be output through a display 5300 or stored in the memory device 1100 through the memory controller 1200. In addition, data stored in the memory device 1100 may be output through the display 5300 under the control of the processor 5100 or the memory controller 1200.

According to an embodiment, the memory controller 1200 capable of controlling the operation of memory device 1100 may be implemented as a part of the processor 5100 or may be implemented as a chip separate from the processor 5100.

Figure 16:
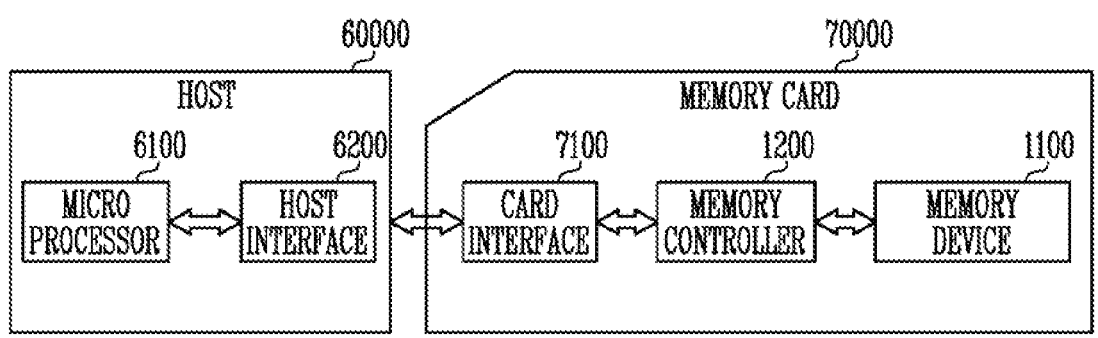
FIG. 16 is a diagram for describing another embodiment of the memory system including the memory device shown in FIG. 2.

FIG. 16 is a diagram for describing another embodiment of a memory system including the memory device shown in FIG. 2.

Referring to FIG. 16, the memory system 70000 may be implemented as a memory card or a smart card. The memory system 70000 may include the memory device 1100, the memory controller 1200, and a card interface 7100.

The memory controller 1200 may control data exchange between the memory device 1100 and the card interface 7100. According to an embodiment, the card interface 7100 may be a secure digital (SD) card interface or a multi-media card (MMC) interface, but is not limited thereto.

The card interface 7100 may interface data exchange between a host 60000 and the memory controller 1200 according to a protocol of the host 60000. According to an embodiment, the card interface 7100 may support a universal serial bus (USB) protocol, and an interchip (IC)-USB protocol. Here, the card interface may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the interface 6200 may perform data communication with the memory device 1100 through the card interface 7100 and the memory controller 1200 under control of a microprocessor 6100.

Although the detailed description of the present disclosure describes specific embodiments, various changes and modifications may be made without departing from the scope and technical spirit of the present disclosure. Therefore, the scope of the present disclosure should not be limited to the above-described embodiments, and should be determined by the equivalents of the claims of the present disclosure as well as the following claims.

What is claimed is:

1. A memory device comprising:
    a memory block;
    a first page buffer group and a second page buffer group connected to bit lines of the memory block; and
    control logic configured to
        generate a first precharge signal for controlling a first sense node precharge operation associated with the first page buffer group and a second precharge signal for controlling a second sense node precharge operation associated with the second page buffer group,
        generate a first disable signal for cutting off the first precharge signal and a second disable signal for cutting off the second precharge signal, and
        perform the first sense node precharge operation associated with the first page buffer group and the second sense node precharge operation associated with the second page buffer group partially simultaneously,
    wherein the first precharge signal and the second precharge signal are divided from a precharge signal,
    wherein an activating timing of the first precharge signal cut off during a set time in response to the first disable signal is different from an activating timing of the second precharge signal.

2. The memory device of claim 1, wherein the control logic performs the first sense node precharge operation associated with the first page buffer group and the second sense node precharge operation associated with the second page buffer group in a different activation start timing from each other.

3. The memory device of claim 2, wherein the control logic performs the first sense node precharge operation associated with the first page buffer group and the second sense node precharge operation associated with the second page buffer group in an identical end timing to each other.

4. The memory device of claim 1, wherein the control logic comprises:
    a precharge signal generator configured to generate the precharge signal;
    a precharge signal divider configured to receive the precharge signal, output the precharge signal as the first precharge signal and the second precharge signal, and cut off the output of the first precharge signal or the second precharge signal during the set time in response to the first disable signal or the second disable signal;
    a register configured to store the set time; and
    a page buffer disable signal generator configured to generate the first disable signal and the second disable signal based on the set time stored in the register.

5. The memory device of claim 4, wherein the precharge signal divider transmits the precharge signal as the first precharge signal to the first page buffer group, and transmits the precharge signal as the second precharge signal to the second page buffer group after the set time stored in the register.

6. The memory device of claim 5, wherein the precharge signal divider comprises:
    a first pass transistor configured to receive the precharge signal, and deactivate the first precharge signal in response to a first page buffer disable signal or transmit the precharge signal as the first precharge signal; and
    a second pass transistor configured to receive the precharge signal, and deactivate the second precharge signal in response to a second page buffer disable signal or transmit the precharge signal as the second precharge signal.

7. The memory device of claim 1, wherein the first page buffer group includes a plurality of page buffers, and
each of the plurality of page buffers precharges the first sense node of each of the plurality of page buffers to a power voltage level in response to the first precharge signal during the first sense node precharge operation.

8. The memory device of claim 1, wherein the second page buffer group includes a plurality of page buffers, and
each of the plurality of page buffers precharges the second sense node of each of the plurality of page buffers to a power voltage level in response to the second precharge signal during the second sense node precharge operation.

9. A memory device comprising:
a memory block;
at least two or more page buffer groups connected to bit lines of the memory block; and
control logic configured to control a read operation for the memory block by controlling the two or more page buffer groups,
wherein the control logic generates two or more division precharge signals corresponding to the two or more respective page buffer groups in response to a precharge signal, and controls activation timings of the two or more respective page buffer groups to be different from each other during precharge operations of the read operation for two or more sense nodes,
wherein the two or more sense nodes are associated with each of the two or more page buffer groups,
wherein start timings for activating the two or more division precharge signals are different from each other.

10. The memory device of claim 9, wherein the control logic configured to control the two or more respective page buffer groups to perform the precharge operations for the two or more sense nodes in different activation start timings from each other.

11. The memory device of claim 10, wherein the control logic configured to control the two or more respective page buffer groups to perform the precharge operations for the two or more sense nodes in identical end timings to each other.

12. The memory device of claim 9, wherein the control logic comprises:
a precharge signal generator configured to generate the precharge signal; and
a precharge divider configured to receive the precharge signal and generate the two or more division precharge signals corresponding to the two or more respective page buffer groups.

13. The memory device of claim 12, wherein the precharge divider controls start timings for activating the two or more division precharge signals to be different from each other and outputs the two or more division precharge signals.

14. The memory device of claim 13, wherein the precharge divider controls the start timings to be different from each other in response to a disable signal corresponding to each of the two or more page buffer groups.

15. A method of operating a memory device, the method comprising:
precharging bit lines of a memory block to a set level, and applying a read voltage to a selected word line of the memory block;
generating a first precharge signal for precharging a first sense node associated with first page buffers connected to the bit lines and a second precharge signal for precharging a second sense node associated with second page buffers connected to the bit lines,
generating a disable signal to cut off the first precharge signal or the second precharge signal during a set time,
precharging the first sense node and the second sense node, and controlling a timing for precharging the first sense node and a timing for precharging the second sense node to be different from each other in response to the disable signal;
performing an evaluation operation to control a potential level of the first sense node associated with the first page buffers and the second sense node associated with the second page buffers based on a current amount of the bit lines; and
sensing the potential level of the first sense node associated with the first page buffers and the second sense node associated with the second page buffers.

16. The method of claim 15, wherein, in precharging the first sense node and the second sense node, an activation start timing of a first sense node precharge operation associated with the first page buffers and an activation start timing of a second sense node-precharge operation associated with the second page buffers are different from each other.

17. The method of claim 16, wherein an end timing of the first sense node precharge operation associated with the first page buffers and an end timing of second sense node precharge operation associated with the second page buffers are identical to each other.

18. The method of claim 15, wherein, in precharging the first sense node and the second sense node,
the first page buffers perform the first sense node precharge operation in response to the first precharge signal, and the second page buffers perform the second sense node precharge operation in response to the second precharge signal, and
the first precharge signal is first activated, and then the second precharge signal is activated.

19. The method of claim 15, wherein, in performing the evaluation operation, the evaluation operation of the first page buffers and the evaluation operation of the second page buffers are performed in the same period.

* * * * *